(12) United States Patent
Camarota

(10) Patent No.: US 8,869,088 B1
(45) Date of Patent: Oct. 21, 2014

(54) OVERSIZED INTERPOSER FORMED FROM A MULTI-PATTERN REGION MASK

(75) Inventor: Rafael C. Camarota, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 141 days.

(21) Appl. No.: 13/535,102

(22) Filed: Jun. 27, 2012

(51) Int. Cl.
*G06F 17/50* (2006.01)

(52) U.S. Cl.
CPC ............................... *G06F 17/5068* (2013.01); *G06F 1/60* (2013.01)
USPC ................ 716/119; 716/50; 716/55; 716/122

(58) Field of Classification Search
None
See application file for complete search history.

(56) References Cited

U.S. PATENT DOCUMENTS

| | | | |
|---|---|---|---|
| 4,467,342 A | 8/1984 | Tower |
| 4,803,595 A | 2/1989 | Kraus et al. |
| 5,285,236 A | 2/1994 | Jain |
| 5,399,898 A | 3/1995 | Rostoker |
| 5,437,946 A | 8/1995 | McCoy |
| 5,489,804 A | 2/1996 | Pasch |
| 5,715,144 A | 2/1998 | Ameen et al. |
| 5,787,007 A | 7/1998 | Bauer |
| 5,814,847 A | 9/1998 | Shihadeh et al. |
| 5,869,894 A | 2/1999 | Degani et al. |
| 5,897,986 A | 4/1999 | Dunn et al. |
| 5,907,903 A | 6/1999 | Ameen et al. |
| 6,157,213 A | 12/2000 | Voogel |
| 6,160,418 A | 12/2000 | Burnham |
| 6,204,689 B1 | 3/2001 | Percey et al. |
| 6,215,327 B1 | 4/2001 | Lyke |
| 6,216,257 B1 | 4/2001 | Agrawal et al. |
| 6,218,864 B1 | 4/2001 | Young et al. |
| 6,239,366 B1 | 5/2001 | Hsuan et al. |
| 6,288,772 B1 | 9/2001 | Shinozaki et al. |
| 6,359,466 B1 | 3/2002 | Sharpe-Geisler |
| 6,369,444 B1 | 4/2002 | Degani et al. |
| 6,396,303 B1 | 5/2002 | Young |
| 6,407,456 B1 | 6/2002 | Ball |
| 6,410,983 B1 | 6/2002 | Moriizumi et al. |
| 6,429,509 B1 | 8/2002 | Hsuan |
| 6,448,808 B2 | 9/2002 | Young et al. |
| 6,500,696 B2 | 12/2002 | Sutherland |
| 6,512,573 B2 | 1/2003 | Fürter |
| 6,525,407 B1 | 2/2003 | Drewery |
| 6,559,531 B1 | 5/2003 | Sutherland |
| 6,583,854 B1 | 6/2003 | Hazama et al. |
| 6,611,635 B1 | 8/2003 | Yoshimura et al. |
| 6,731,009 B1 | 5/2004 | Jones et al. |

(Continued)

FOREIGN PATENT DOCUMENTS

EP  2 151717 A1  2/2010

OTHER PUBLICATIONS

U.S. Appl. No. 13/369,215, filed Feb. 8, 2012, Banijamali, Bahareh, Xilinx, Inc., 2100 Logic Drive, San Jose, CA US.

(Continued)

*Primary Examiner* — Leigh Garbowski
(74) *Attorney, Agent, or Firm* — W. Eric Webostad

(57) ABSTRACT

An embodiment of an interposer is disclosed. In such an embodiment, there is a first printed circuit region and a second printed circuit region. The second printed circuit region is proximate to the first printed circuit region with a seam region between the first printed circuit region and the second printed circuit region. The seam region includes a first die seal and a second die seal spaced apart from one another with a scribe line located between the first die seal and the second die seal.

19 Claims, 11 Drawing Sheets

(56) References Cited

U.S. PATENT DOCUMENTS

| | | |
|---|---|---|
| 6,734,553 B2 | 5/2004 | Kimura |
| 6,870,271 B2 | 3/2005 | Sutherland et al. |
| 6,930,378 B1 | 8/2005 | St. Amand et al. |
| 6,944,809 B2 | 9/2005 | Lai et al. |
| 6,972,487 B2 | 12/2005 | Kato et al. |
| 6,984,889 B2 | 1/2006 | Kimura |
| 6,992,395 B2 | 1/2006 | Fukasawa |
| 7,002,828 B2 | 2/2006 | Santin et al. |
| 7,028,281 B1 | 4/2006 | Agrawal et al. |
| 7,030,466 B1 | 4/2006 | Hsuan |
| 7,071,568 B1 | 7/2006 | St. Amand et al. |
| 7,087,989 B2 | 8/2006 | Nakayama |
| 7,088,134 B1 | 8/2006 | Agrawal et al. |
| 7,095,253 B1 | 8/2006 | Young |
| 7,098,542 B1 | 8/2006 | Hoang et al. |
| 7,107,565 B1 | 9/2006 | Lindholm et al. |
| 7,132,753 B1 | 11/2006 | St. Amand et al. |
| 7,181,718 B1 | 2/2007 | Bilski et al. |
| 7,187,200 B2 | 3/2007 | Young |
| 7,190,190 B1 | 3/2007 | Camarota et al. |
| 7,193,433 B1 | 3/2007 | Young |
| 7,196,543 B1 | 3/2007 | Young et al. |
| 7,199,610 B1 | 4/2007 | Young et al. |
| 7,202,697 B1 | 4/2007 | Kondapalli et al. |
| 7,202,698 B1 | 4/2007 | Bauer et al. |
| 7,205,790 B1 | 4/2007 | Young |
| 7,215,016 B2 | 5/2007 | Wang |
| 7,215,138 B1 | 5/2007 | Kondapalli et al. |
| 7,218,139 B1 | 5/2007 | Young et al. |
| 7,218,140 B1 | 5/2007 | Young |
| 7,218,143 B1 | 5/2007 | Young |
| 7,221,186 B1 | 5/2007 | Young |
| 7,230,329 B2 | 6/2007 | Sawamoto et al. |
| 7,233,168 B1 | 6/2007 | Simkins |
| 7,253,658 B1 | 8/2007 | Young |
| 7,256,612 B1 | 8/2007 | Young et al. |
| 7,265,576 B1 | 9/2007 | Kondapalli et al. |
| 7,268,587 B1 | 9/2007 | Pham et al. |
| 7,274,214 B1 | 9/2007 | Young |
| 7,276,934 B1 | 10/2007 | Young |
| 7,279,929 B1 | 10/2007 | Young |
| 7,284,226 B1 | 10/2007 | Kondapalli |
| 7,301,824 B1 | 11/2007 | New |
| 7,314,174 B1 | 1/2008 | Vadi et al. |
| 7,337,422 B1 | 2/2008 | Becker et al. |
| 7,345,507 B1 | 3/2008 | Young et al. |
| 7,402,443 B1 | 7/2008 | Pang et al. |
| 7,402,901 B2 | 7/2008 | Hatano et al. |
| 7,425,760 B1 | 9/2008 | Guenin et al. |
| 7,436,061 B2 | 10/2008 | Nakayama |
| 7,451,421 B1 | 11/2008 | Bauer et al. |
| 7,459,776 B1 | 12/2008 | St. Amand et al. |
| 7,491,576 B1 | 2/2009 | Young et al. |
| 7,498,192 B1 | 3/2009 | Goetting et al. |
| 7,859,119 B1 | 12/2010 | St. Amand et al. |
| 7,906,852 B2 | 3/2011 | Nishimura et al. |
| 7,999,383 B2 | 8/2011 | Hollis |
| 8,001,511 B1 | 8/2011 | Bauer et al. |
| 8,062,968 B1 | 11/2011 | Conn |
| 8,072,057 B2 | 12/2011 | Matsumura |
| 8,080,874 B1 | 12/2011 | Werner et al. |
| 8,097,957 B2 | 1/2012 | Chen et al. |
| 8,163,600 B2 | 4/2012 | Chow et al. |
| 8,227,904 B2 | 7/2012 | Braunisch et al. |
| 8,237,289 B2 | 8/2012 | Urakawa |
| 8,274,794 B2 | 9/2012 | Huang et al. |
| 8,295,056 B2 | 10/2012 | Andry et al. |
| 8,338,963 B2 | 12/2012 | Haba et al. |
| 8,344,519 B2 | 1/2013 | Lu et al. |
| 8,415,783 B1 | 4/2013 | Rahman et al. |
| 2002/0024146 A1 | 2/2002 | Furusawa |
| 2002/0175421 A1 | 11/2002 | Kimura |
| 2003/0183917 A1 | 10/2003 | Tsai et al. |
| 2004/0184250 A1 | 9/2004 | Wang |
| 2004/0195668 A1 | 10/2004 | Sawamoto |
| 2004/0195682 A1 | 10/2004 | Kimura |
| 2004/0227223 A1 | 11/2004 | Sawamoto |
| 2005/0112614 A1 | 5/2005 | Cook et al. |
| 2006/0001163 A1 | 1/2006 | Kolbehdari et al. |
| 2006/0017147 A1 | 1/2006 | Drost et al. |
| 2006/0099736 A1 | 5/2006 | Nagar et al. |
| 2006/0157866 A1 | 7/2006 | Le et al. |
| 2006/0220227 A1 | 10/2006 | Marro |
| 2006/0226527 A1 | 10/2006 | Hatano et al. |
| 2006/0226529 A1 | 10/2006 | Kato et al. |
| 2007/0023921 A1 | 2/2007 | Zingher et al. |
| 2007/0029646 A1 | 2/2007 | Voldman |
| 2007/0204252 A1 | 8/2007 | Furnish et al. |
| 2007/0210428 A1 | 9/2007 | Tan et al. |
| 2007/0231966 A1 | 10/2007 | Egawa |
| 2007/0278642 A1 | 12/2007 | Yamaguchi et al. |
| 2008/0179735 A1 | 7/2008 | Urakawa |
| 2009/0057919 A1 | 3/2009 | Lin et al. |
| 2009/0267238 A1 | 10/2009 | Joseph et al. |
| 2010/0330741 A1 | 12/2010 | Huang et al. |
| 2011/0019368 A1 | 1/2011 | Andry et al. |
| 2011/0169171 A1 | 7/2011 | Marcoux |
| 2011/0180317 A1 | 7/2011 | Takahashi et al. |
| 2011/0254162 A1 | 10/2011 | Hollis |
| 2011/0316572 A1 | 12/2011 | Rahman |
| 2012/0019292 A1 | 1/2012 | Lu et al. |
| 2012/0020027 A1 | 1/2012 | Dungan et al. |
| 2012/0032342 A1 | 2/2012 | Min et al. |
| 2012/0124257 A1 | 5/2012 | Wu |
| 2012/0206889 A1 | 8/2012 | Norman |
| 2012/0301977 A1 | 11/2012 | Andry et al. |
| 2012/0319248 A1 | 12/2012 | Rahman |
| 2013/0020675 A1 | 1/2013 | Kireev et al. |
| 2013/0134553 A1 | 5/2013 | Kuo et al. |
| 2014/0049932 A1 | 2/2014 | Camarota |
| 2014/0070423 A1 | 3/2014 | Woychik et al. |
| 2014/0077391 A1 | 3/2014 | Kikuchi et al. |
| 2014/0084459 A1 | 3/2014 | Yue et al. |

OTHER PUBLICATIONS

U.S. Appl. No. 13/399,939, filed Feb. 17, 2012, Wu, Ephrem C., Xilinx, Inc., 2100 Logic Drive, San Jose, CA US.

U.S. Appl. No. 13/527,453, filed Jun. 19, 2012, Hisamura, Toshiyuki, Xilinx, Inc., 2100 Logic Drive, San Jose, CA US.

U.S. Appl. No. 13/935,066, filed Jul. 3, 2013, Camarota.

Chi, Chun-Chuan et al., "Post-Bond Testing of 2.5D-SICs and 3D-SICs Containing a Passive Silicon Interposer Base," *Proc. of the 2011 IEEE International Test Conference*, Sep. 20, 2011, pp. 1-10, IEEE,.Piscataway, New Jersey, USA.

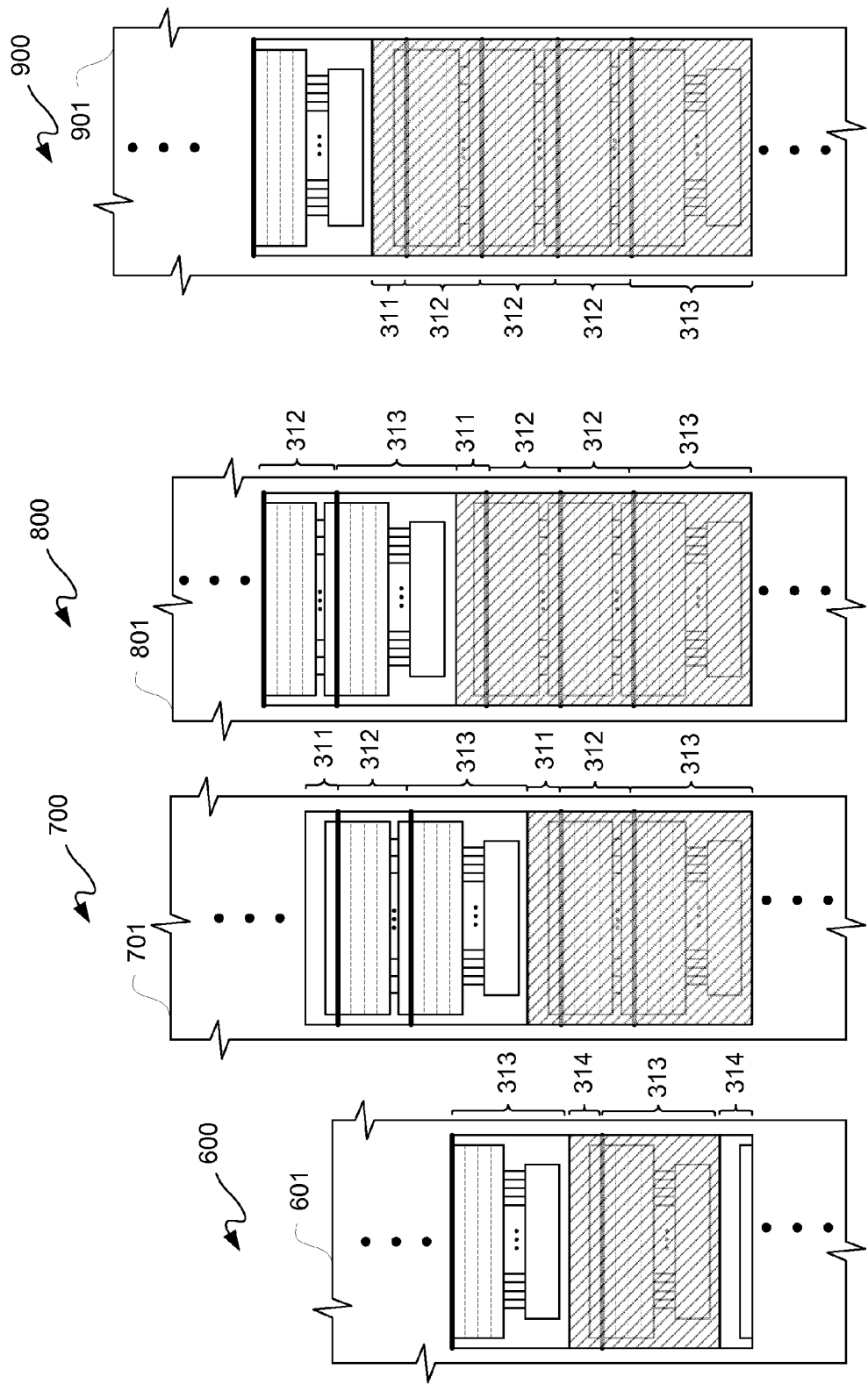

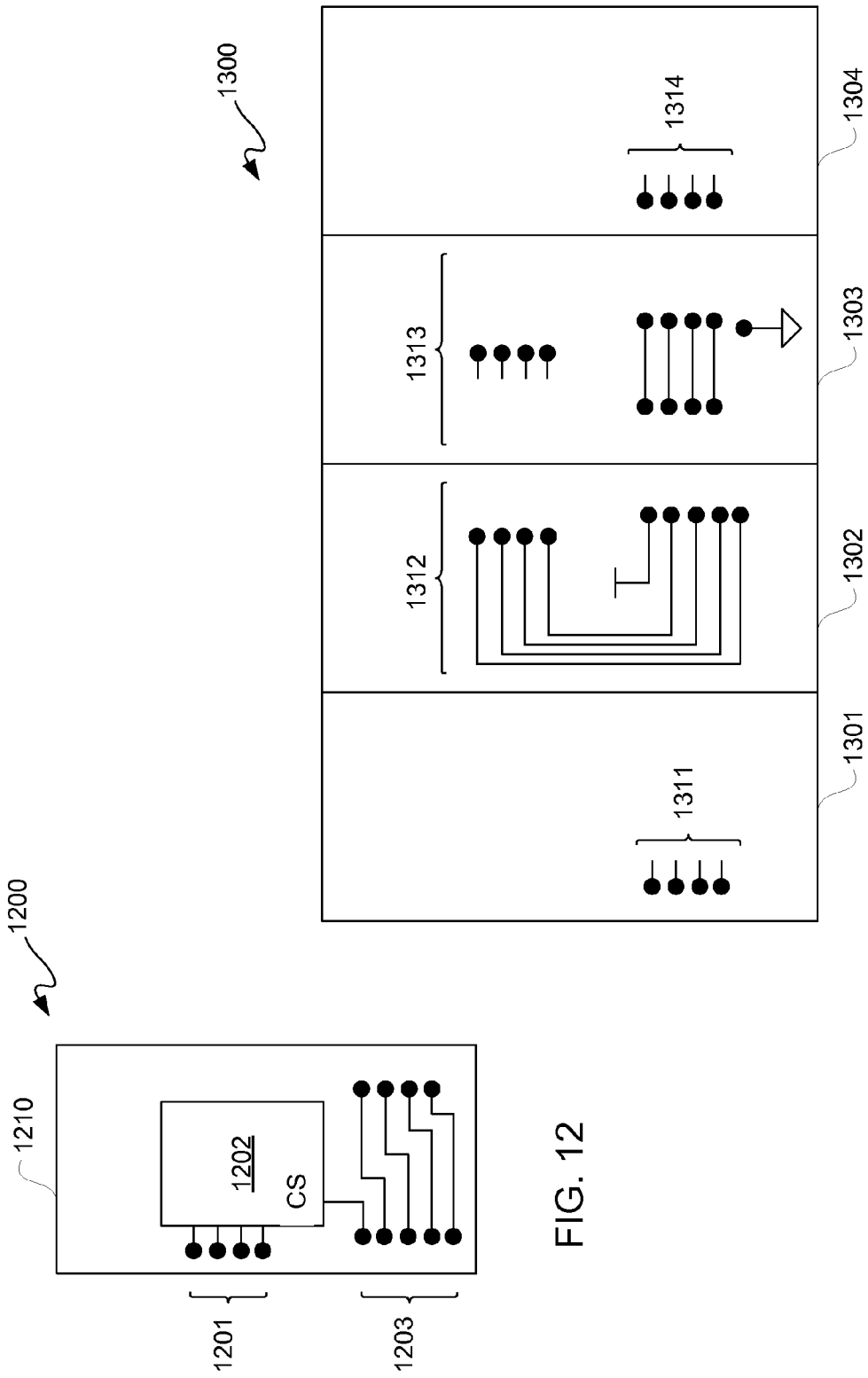

US 8,869,088 B1

OVERSIZED INTERPOSER FORMED FROM A MULTI-PATTERN REGION MASK

FIELD OF THE INVENTION

An embodiment relates to integrated circuit devices ("ICs"). More particularly, an embodiment relates to an oversized interposer for an IC.

BACKGROUND

Integrated circuits have become more "dense" over time, i.e., more logic features have been implemented in an IC. More recently, Stacked-Silicon Interconnect Technology ("SSIT") allows for more than one semiconductor die to be placed in a single package. SSIT ICs may be used to address increased demand for having various ICs within a single package. However, even though ICs using SSIT have more than one die, such ICs still have significant restriction due to interposer size. Conventionally, an interposer has been limited due to maximum field size of a reticle of a lithographic scanner. Hence, it is desirable to provide a larger interposer that is not so restricted to a maximum scanner field size restriction.

SUMMARY

One or more embodiments generally relate to an oversized interposer.

An embodiment relates generally to an interposer. In such an embodiment, there are a first printed circuit region and a second printed circuit region. The second printed circuit region is proximate to the first printed circuit region with a first seam region between the first printed circuit region and the second printed circuit region. The first seam region includes a first die seal and a second die seal spaced apart from one another with a first scribe line located between the first die seal and the second die seal.

Another embodiment relates generally to a lithographic mask. In such an embodiment, an image region is divided into a first pattern region, a second pattern region, and a third pattern region. The first pattern region is for interconnecting a first portion of a first die to an interposer. The second pattern region is for interconnecting a second portion of the first die and a first portion of a second die to the interposer. The third pattern region is for interconnecting a second portion of the second die to the interposer. The second pattern region is repeatable for the interposer to have a length or a width greater than a maximum length or a maximum width, respectively, of a reticle field size of a lithographic scanner.

Yet another embodiment relates generally to a method for lithographically printing. A mask and a wafer with a resist layer are loaded in a lithographic scanner for creating an interposer. The mask has an image region divided into a first pattern region, a second pattern region, and a third pattern region. The third pattern region is shuttered off. The first pattern region and the second pattern region are imaged onto the resist layer to respectively print an instance of a first printed circuit region and a first instance of a second printed circuit region with an instance of a first seam region and a first instance of a second seam region respectively associated therewith. The first pattern region is shuttered off. The second pattern region and the third pattern region are imaged onto the resist layer to respectively print a second instance of the second printed circuit region with a second instance of the second seam region and an instance of a third printed circuit region. The second pattern region with the second seam region is repeatable for the interposer to have a length or width greater than a maximum length or a maximum width, respectively, of a reticle field size of the lithographic scanner.

BRIEF DESCRIPTION OF THE DRAWINGS

Accompanying drawings show exemplary embodiments. However, the accompanying drawings should not be taken to limit the embodiments shown, but are for explanation and understanding only.

FIG. 6 is a block diagram depicting an exemplary embodiment of an interposer lithographically imaged ("printed") using the mask of FIG. 3.

FIG. 7 is a block diagram depicting an exemplary embodiment of an interposer printed using the mask of FIG. 3.

FIG. 8 is a block diagram depicting an exemplary embodiment of an interposer printed using the mask of FIG. 3.

FIG. 9 is a block diagram depicting an exemplary embodiment of an interposer printed using the mask of FIG. 3.

FIG. 12 is a block/circuit diagram depicting an exemplary embodiment of a repeatable die.

FIG. 13 is a block diagram/circuit depicting an exemplary embodiment of a multi-section interconnect mask.

DETAILED DESCRIPTION

Figure 1:
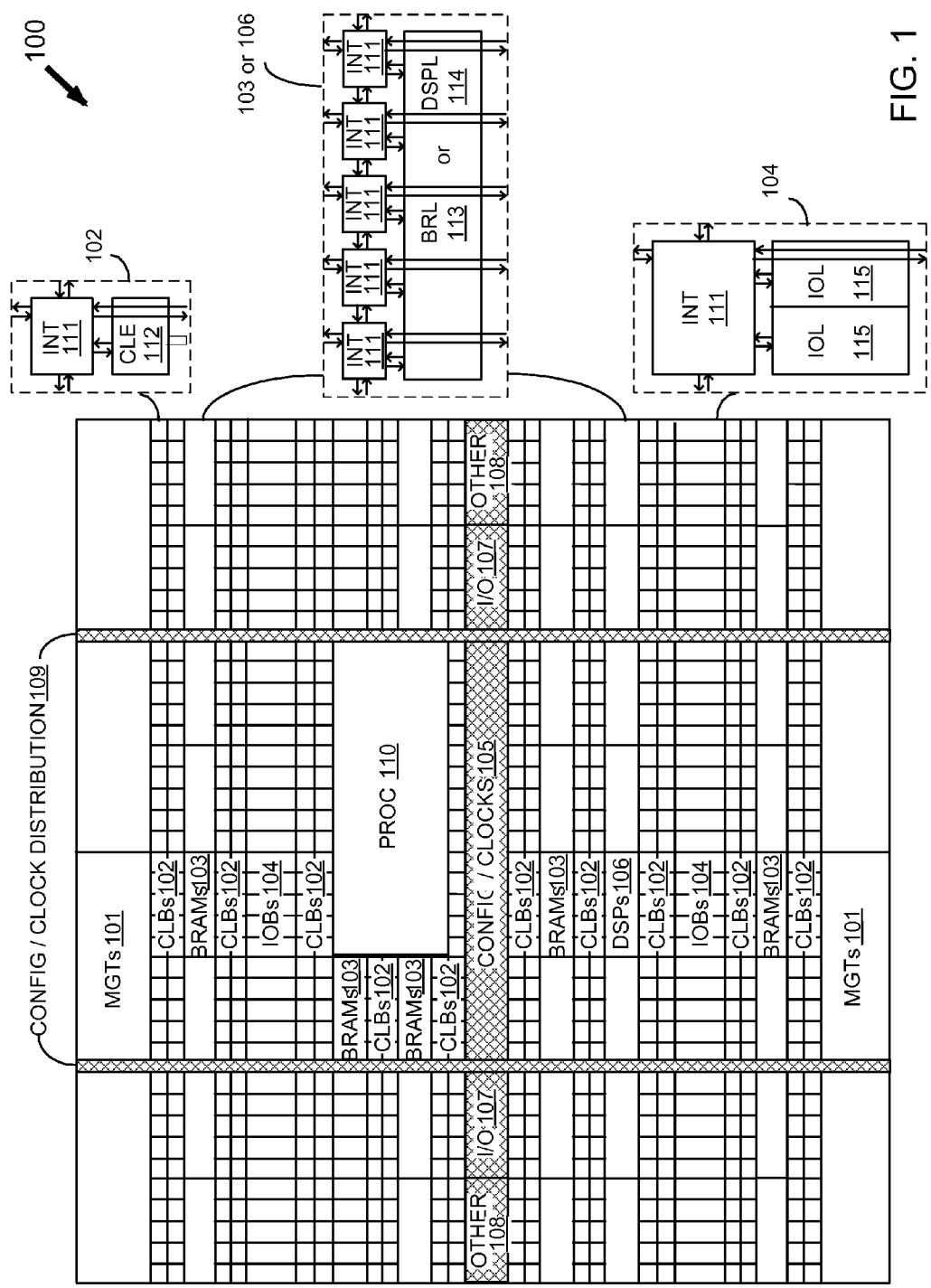
FIG. 1 is a simplified block diagram depicting an exemplary embodiment of a columnar Field Programmable Gate Array ("FPGA") architecture.

In the following description, numerous specific details are set forth to provide a more thorough description of the specific embodiments. It should be apparent, however, to one skilled in the art, that one or more embodiments may be practiced without all the specific details given below. In other instances, well known features have not been described in detail so as not to obscure the one or more embodiments. For ease of illustration, the same number labels are used in different diagrams to refer to the same items; however, in alternative embodiments the items may be different.

Before describing exemplary embodiments illustratively depicted in the several figures, a general introduction is provided to further understanding.

A lithographic scanner has a reticle field size limitation. The limited size of the reticle field heretofore limited the size of an interposer that could be created. For example, a conventional scanner field size limit is 26 mm by 33 mm. However, larger interposers are needed in order to accommodate more and/or larger integrated circuit dies in order to improve performance and/or increase pin-count density. Larger scanner field sizes may be available, and thus it shall be assumed that a scanner field size limit is at least 26 mm by at least 33 mm.

With the above general understanding borne in mind, various embodiments for a larger interposer, as well as methodology for creating same, are generally described below. A larger interposer may be created using multistep imaging by effectively dividing interconnects of a modular die to be mounted onto an interposer into image slices ("slices") and lithographically stitching the slices together. Such multistep imaging may use a multi-pattern region mask for creating an oversized interposer, namely an interposer having at least one dimension greater than a maximum reticle field size limit. By having double-seal seam regions, interconnect circuit slices of an interposer may be coupled to one another using die bridging. Along those lines, multiple slices may be imaged to create an interposer larger than at least one maximum dimension afforded by reticle field size of a lithographic scanner.

Because one or more of the above-described embodiments are exemplified using a particular type of IC, a detailed description of such an IC is provided below. However, it should be understood that other types of ICs may benefit from one or more of the embodiments described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

As noted above, advanced FPGAs can include several different types of programmable logic blocks in the array. For example, FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 1.

For example, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the pictured embodiment, a horizontal area near the center of the die (shown in FIG. 1) is used for configuration, clock, and other control logic. Vertical columns 109 extending from this horizontal area or column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, processor block 110 spans several columns of CLBs and BRAMs. Note that FIG. 1 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA. An FPGA, such as FPGA 100 may be coupled to an interposer or carrier, as described below in additional detail. An aspect of such an interposer is that it may have 2 or more instances of the same die type. In an embodiment the repeated die are PLDs, such as FPGAs 100 for example, but the same techniques for multi-mask exposure and for signal bridging may be used for other die types, including without limitation DRAM, Flash Memory, image sensors, or high speed transceivers, among other types of die.

Figure 2:
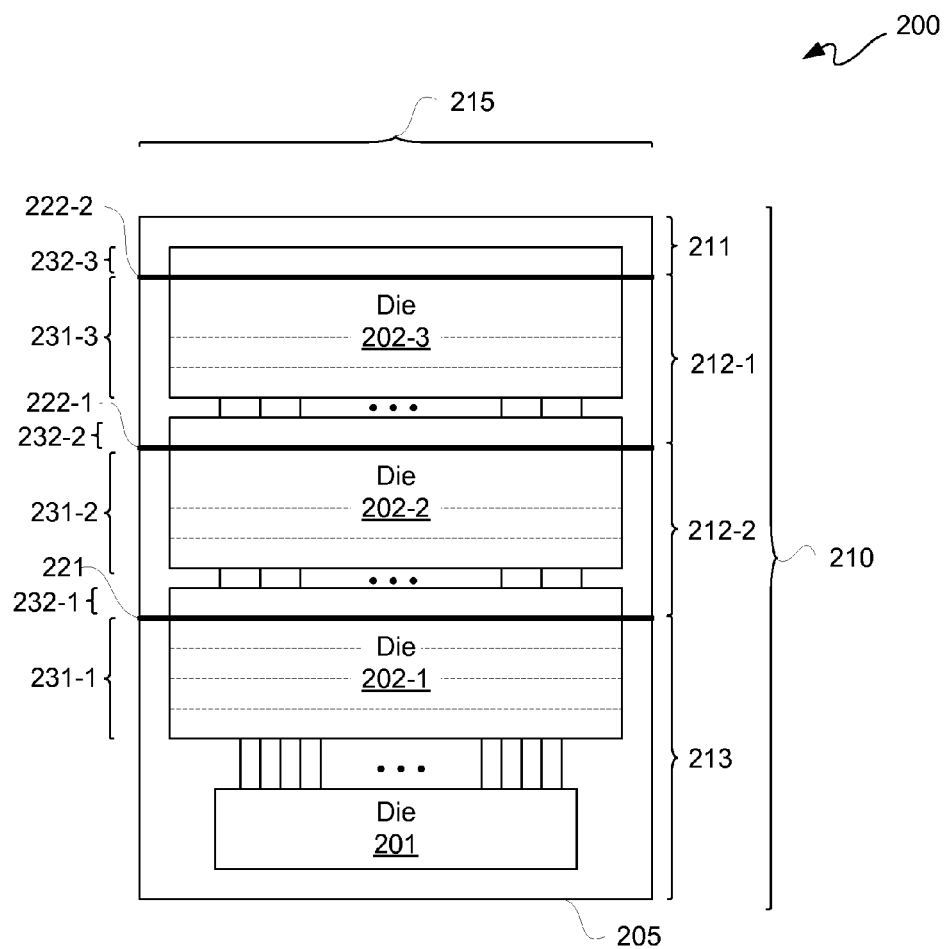
FIG. 2 is a block diagram depicting an exemplary embodiment of a stacked die assembly.

FIG. 2 is a block diagram depicting an exemplary embodiment of a stacked die assembly 200. Stacked die assembly 200 includes interposer 205 having coupled thereto IC die 201 and IC dies 202-1 through 202-3. IC die 201 may be any type of IC die, including without limitation a memory die, a voltage regulator die, or a high-speed interface die, among other types of IC dies. For purposes of clarity by way of example and not limitation, it shall be assumed that IC die 201 is a high-speed serial I/O ("HSS I/O") die; however, in other embodiments this or another type of IC die may be used. Furthermore, in other embodiments, more than one IC die 201 of same or differing type may be used. In yet other embodiments, different types of die may be used between one or more of IC dies 202-1 through 202-3.

IC dies 202-1 through 202-3 may be any type of modularly architected repeatable die. For purposes of clarity by way of example not limitation, FPGA IC dies 202-1 through 202-3 are described; however, in other embodiments other types of modularly architected repeatable IC dies may be used.

Generally, FPGA IC dies 202-1 through 202-3 are flip-chip dies. Thus, micro bumps may be used for die-to-die interconnects.

FPGA IC dies 202-1 through 202-3 respectively bridge seam regions 221, 222-1, and 222-2. Seam regions 221, 222-1, and 222-2 all have a "double seam" to take advantage of symmetry and of repeating nature of modular FPGA IC dies 202-1 through 202-3. By a "double seal", it is generally meant a seam region having two die seals, one on either side of the seam.

Interconnects between FPGA IC dies 202-1 through 202-3, as well as between HSS I/O die 201 and one or more of FPGA IC dies 202-1 through 202-3, may respectively be printed as separate circuit regions ("printed circuit regions"), namely with separate pattern regions as described below in additional detail. By repeated imaging of separate printed circuit regions, interposer 205 may have at least one dimension therefor allowed by a lithographic scanner reticle field size. In this embodiment, interposer 205 includes four printed circuit regions 211, 212-1, 212-2, and 213. In this exemplary embodiment, printed circuit region 213 includes seam region 221, a slice 231-1 of interposer 205-to-FPGA IC die 202-1 interconnects, interposer 205-to-HSS I/O die 201 interconnects, and HSS I/O die 201-to-FPGA IC die 202-1 interconnects, as well as interconnects for bridging seam region 221 and through substrate interconnects (not shown), among other interconnects. For purposes of clarity by way of example not limitation, it shall be assumed that interposer 205 is a silicon substrate based interposer, and thus through substrate interconnects are through substrate vias ("TSVs"). However, it should be understood that in other embodiments, interposer 205 may be a dielectric substrate based interposer or other semiconductor substrate based interposer.

Printed circuit regions 212-1 and 212-2 may be repeats of one another, namely printed circuit regions 212. Each of printed circuit regions 212 includes interconnects for two FPGA die slices to be generally partially located in such regions when corresponding such FPGA dies are coupled to interposer 205. In this exemplary embodiment, printed circuit region 212-2 includes seam region 222-1, a slice 231-2 of interposer 205-to-FPGA IC die 202-2 interconnects, a slice 232-1 of interposer 205-to-FPGA IC die 202-1 interconnects, TSVs (not shown), and FPGA IC die 202-1-to-FPGA IC die 202-2 interconnects, as well as any interconnects for bridging seam regions 221 and 222-1, among other interconnects. In this exemplary embodiment, printed circuit region 212-1 includes seam region 222-2, a slice 231-3 of interposer 205-to-FPGA IC die 202-3 interconnects, a slice 232-2 of interposer 205-to-FPGA IC die 202-2 interconnects, TSVs (not shown), and FPGA IC die 202-2-to-FPGA IC die 202-3 interconnects, as well as any interconnects for bridging seam regions 222-1 and 222-2, among other interconnects.

Printed circuit region 211 includes, a slice 232-3 of interposer 205-to-FPGA IC die 202-3 interconnects, and TSVs (not shown), as well as any interconnects for bridging seam region 222-2, among other interconnects.

For purposes of clarity by way of example and not limitation, presently conventionally a maximum lithographic reticle field size allows for an interposer to be formed with a width of 26 mm and a length of 33 mm. In an exemplary embodiment, interposer 205 is formed with a width of approximately 25 mm and a length of approximately 34.4 mm. However, in other embodiments, other dimensions may be used in accordance with the following description.

Either width 215 or length 210 may be formed to be larger than a conventional maximum lithographic reticle field size dimension associated therewith by multiple-step imaging as described below. Even though the following description is in terms of having length 210 larger than a conventional maximum lithographic reticle field size length dimension, in other embodiments width 215 may be larger than a conventional maximum lithographic reticle field size width dimension.

Figure 3:
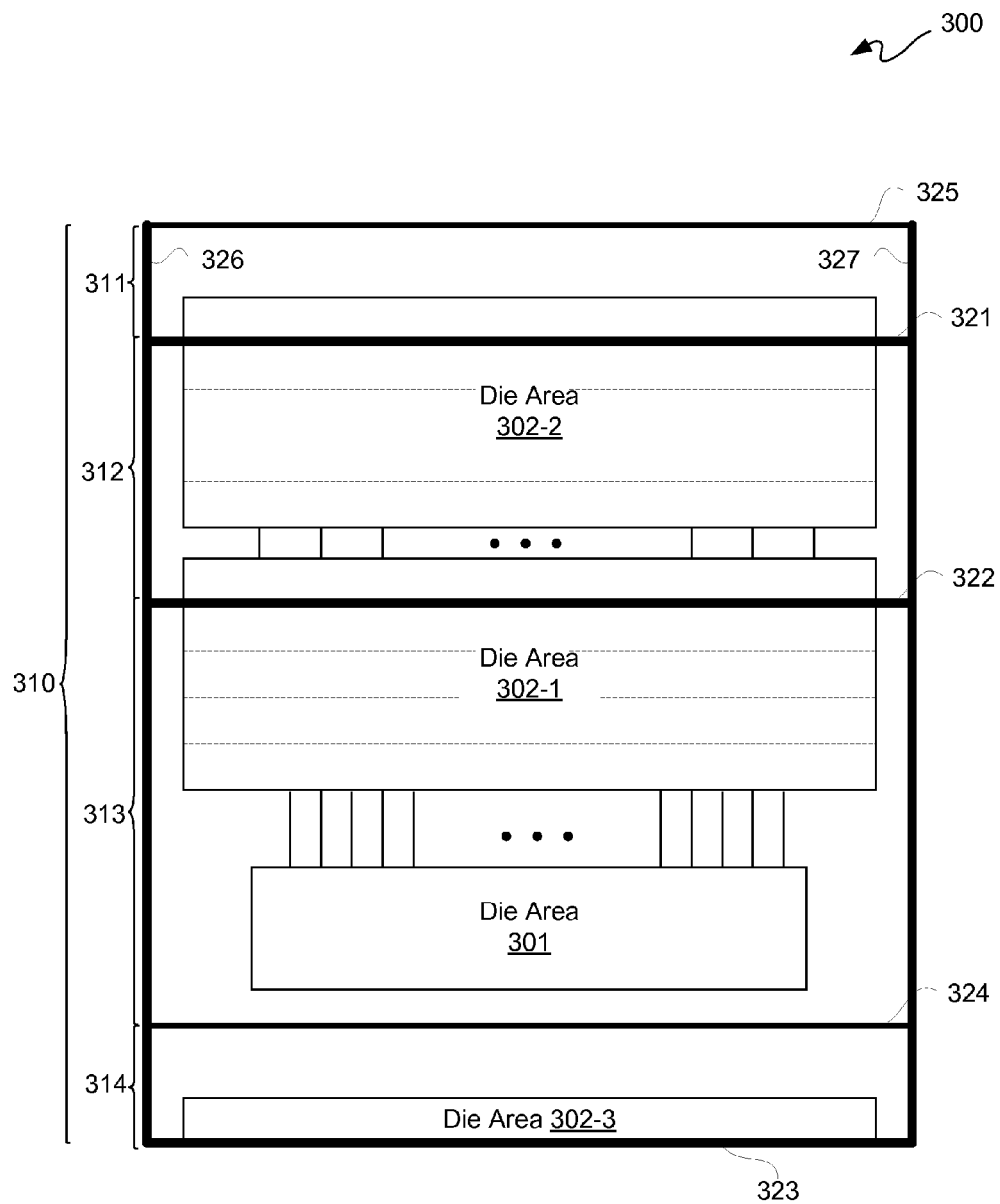
FIG. 3 is a block diagram depicting an exemplary embodiment of a lithographic mask ("mask").

FIG. 3 is a block diagram depicting an exemplary embodiment of a lithographic mask ("mask") 300. In this exemplary embodiment, mask 300 includes four pattern regions 311 through 314 of an image region 310. Pattern regions 312 through 313 correspond to lithographically imaged ("printed") circuit regions 212 and 213, respectively, of FIG. 2. Pattern region 311 corresponds to printed circuit region 211 of FIG. 2. In this exemplary embodiment, pattern regions 311 and 314 are identical. However, in other embodiments, pattern regions 311 and 314 may be different.

Pattern region 314 includes an image pattern for interconnects of a slice of a die area 302-3 and for die seals and a scribe line of a seam region 323. In one sense, such a scribe line is a dummy scribe line, as an interposer is not diced along such scribe line; however, for registration for lithographic imaging, such scribe line may be used. Pattern region 313 includes an image pattern for interconnects of a slice of die area 302-1 and die area 301, as well as other interconnects as previously described herein with respect to printed circuit region 213 of FIG. 2. Such image pattern for pattern region 313 further includes imaging for die seals and a scribe line for seam area 322. Pattern region 312 includes an image pattern for interconnects of a slice of die area 302-1 and a slice of die area 302-2, as well as other interconnects as previously described herein with respect to printed circuit region 212 of FIG. 2. Such image pattern for pattern region 312 further includes imaging for die seals for seam area 321. Lastly, pattern region 311 includes an image pattern for interconnects of a slice of die area 302-2, as well as other interconnects as previously described herein with respect to printed circuit region 211 of FIG. 2.

Seam areas, such as seam areas 321 through 323, may be architected or otherwise designed for a minimum or no interposer traces crossing boundaries associated therewith. Making reliable connections across seam regions associated with seam areas 321 through 323, namely at intersections of two shutter edges from two sequential mask exposures, may be problematic. Along those lines, a channel region may be defined or otherwise created without micro bumps and without traces to correspond to a shutter defined seam region on an interposer.

Figure 11:
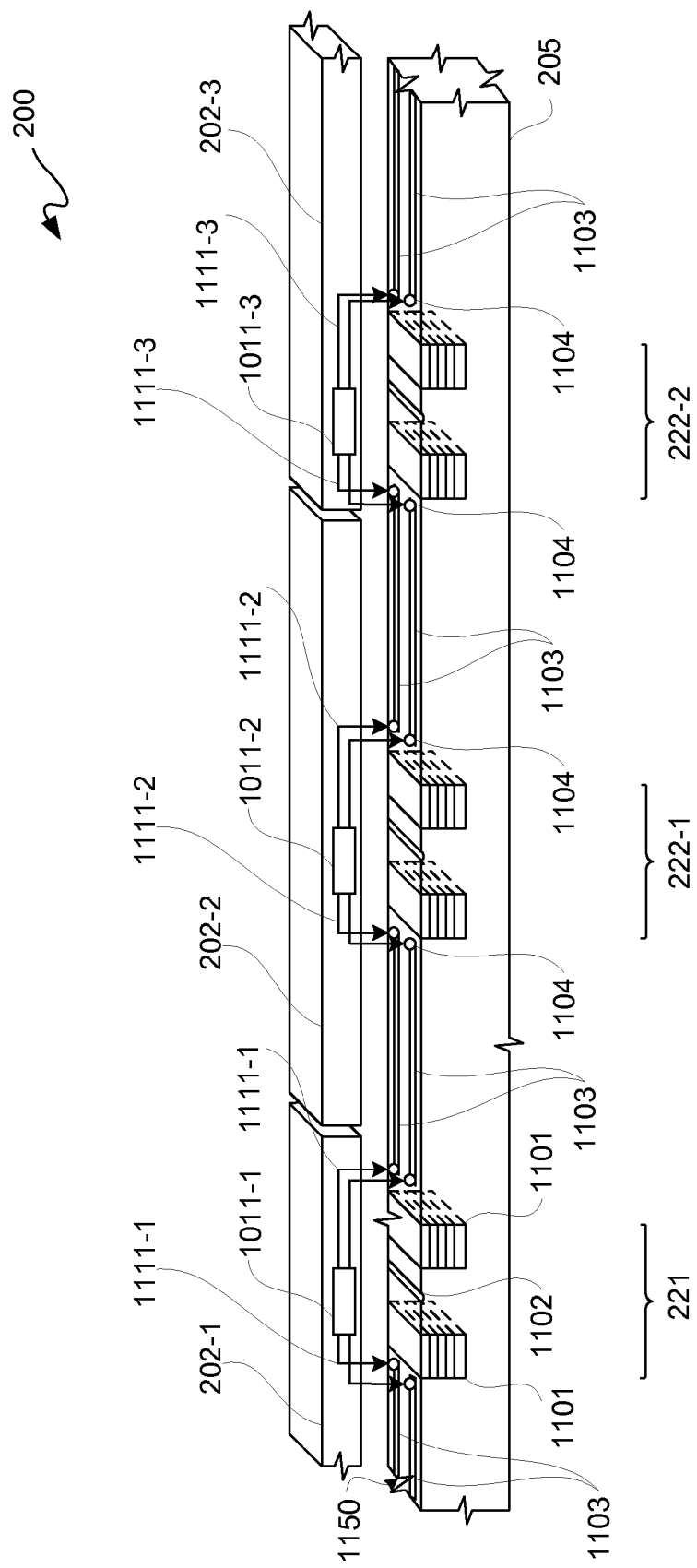
FIG. 11 is a block/perspective diagram depicting an exemplary embodiment of a portion of the stacked die assembly of FIG. 2.

FIG. 11 is a block/perspective diagram depicting an exemplary embodiment of a portion of stacked die assembly 200. Stacked die assembly 200 in seam regions 221, 222-1, and 222-2 includes respective pairs of die seals with a scribe line disposed between such die seals. For example, with reference to seam region 221, there are two spaced apart die seals 1101 with a scribe line 1102 located between such die seals 1101. Seam region 221 may be devoid of any micro bumps and traces on an uppermost surface 1150 of interposer 205.

Returning to FIG. 3, pattern region 314 includes seam area 323, and pattern region 311 does not include a seam area. Likewise, printed circuit region 211 does not include a seam region. Because mask 300 may use multiple exposures of pattern regions of various sequences across a wafer, having both pattern regions 311 and 314 may be useful so as not having to perform extra exposure operations.

Region 311 has half of a "standard" scribe line 325. Regions 313 and 314 are divided by a "standard" scribe line 324. All regions have a "standard" scribe line 326 or 327 on the left and right edges, respectively. A "standard" scribe line is a designated line and associated line width used for cutting a wafer into individual die. All multiple exposure masks can end with a standard scribe on all four sides and not have a die seal on an outside edge.

Figures 4, 5:
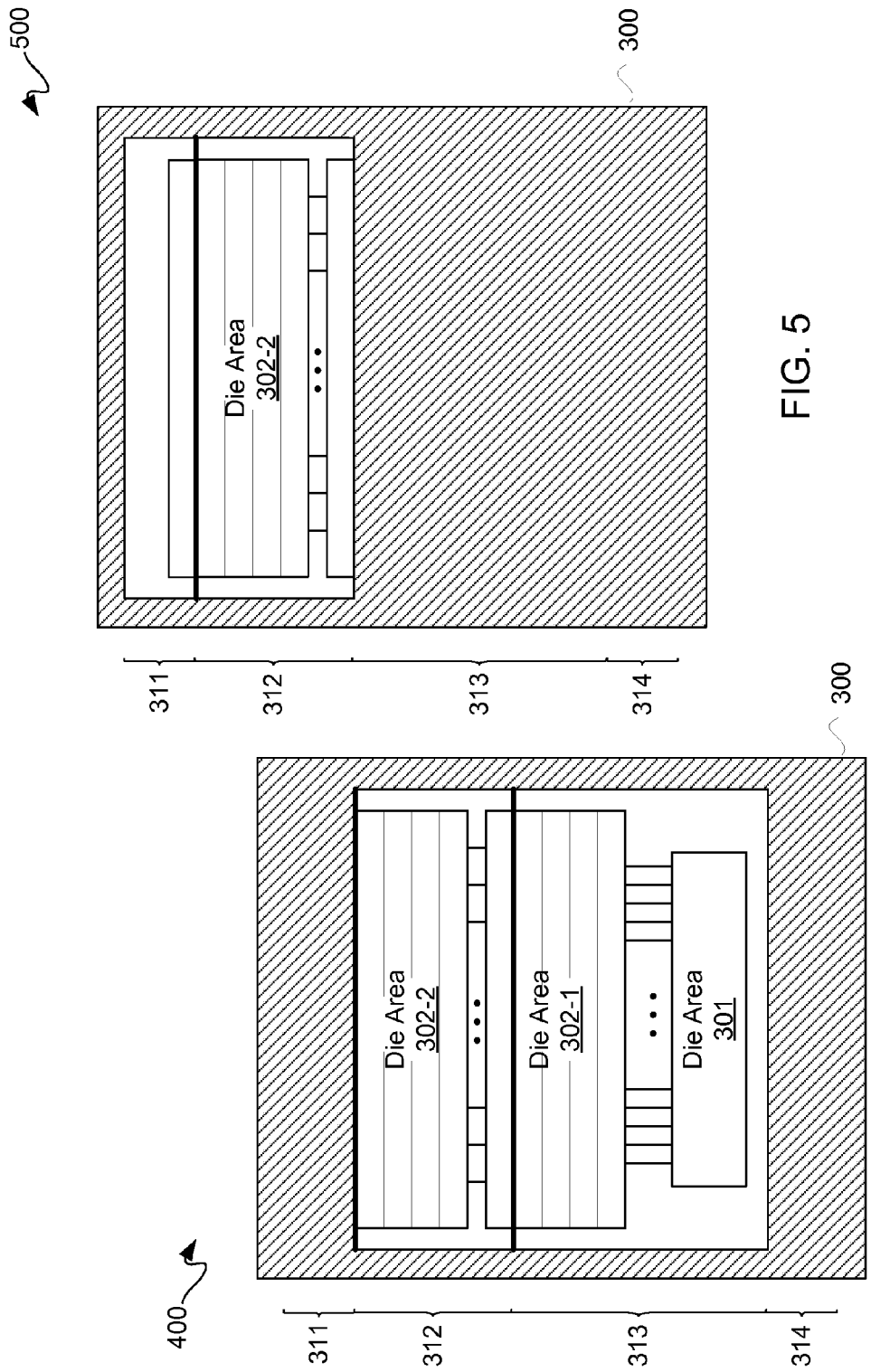
FIG. 4 is a block diagram depicting an exemplary embodiment of the mask of FIG. 3 with sections shuttered off.
FIG. 5 is a block diagram depicting an exemplary embodiment of the mask of FIG. 3 at a time later with respect to FIG. 4 with sections shuttered off.

FIG. 4 is a block diagram depicting an exemplary embodiment of mask 300 of FIG. 3 with sections shuttered off, such as by a lithographic scanner in which mask 300 is loaded. For an operation 400, pattern region 311 and pattern region 314 of mask 300 may be shuttered off to prevent lithographic imaging ("printing") of those regions onto a resist layer on a wafer loaded in a lithographic scanner. Furthermore, for operation 400, pattern regions 313 and 312 may be exposed to allow printing of those regions onto such a resist layer of such a wafer loaded in such a lithographic scanner. It should be understood that die areas are generally indicated for interconnects associated there with. In other words, such die areas generally indicate locations for interconnects for dies to be mounted to an interposer in such areas.

FIG. 5 is a block diagram depicting an exemplary embodiment of mask 300 of FIG. 3 at a time later with respect to FIG. 4 with sections shuttered off, such as the same lithographic scanner used for operation 400. For an operation 500, pattern regions 313 and 314 may be shuttered off to prevent printing of those regions onto such a resist layer on such wafer loaded in such a lithographic scanner, as previously described with reference to FIG. 4. Furthermore, for operation 500, pattern regions 311 and 312 may be exposed to allow printing of those regions onto such a resist layer of such a wafer loaded in such lithographic scanner. Along those lines, it should be understood that printing of pattern region 312 is repeated in operation 500 with respect to such printing of such region in operation 400. However, in operation 500, such repeated printing of pattern region 312 is offset from printing of such region in operation 400 so as to form adjacent printings of pattern region 312 on a wafer.

Accordingly, by shuttering off one or more selected pattern regions of mask 300, multiple configurations of interposers may be created. Furthermore, by shuttering off one or more selected pattern regions of mask 300 and performing multiple sequential exposures, multiple configurations of interposers having a dimension longer, or wider, than conventionally allowed by a lithographic scanner reticle field size may be created. Thus, the positioning of shutters and the number of mask exposures may be used to create one or more configurations of interposers.

For example, to create the exemplary embodiment of interposer 205 of FIG. 2, shuttered mask 300 of operation 400 may be first exposed on a first row of a wafer in order to lithographically image ("print") circuitry associated with pattern regions 312 and 313 without printing circuitry associated with pattern regions 311 and 314. On a next row of such a wafer above such first row, operation 500 may be performed as a subsequent exposure to print circuitry on such wafer associated with pattern regions 311 and 312 without printing circuitry associated with pattern regions 313 and 314. Along those lines, another row with pattern regions 311 and 314 shuttered may be exposed followed by yet another row with pattern regions 313 and 314 shuttered, and so on, to create multiple instances of interposer 205 on a wafer.

In this exemplary embodiment, pattern region 314 is not used to make interposer 205, and thus pattern region 314 is optional. However, in an embodiment with a smaller version of interposer 205, pattern region 314 may be used. For example, a subsequent operation 400, namely an operation with pattern region 311 shuttered, may be performed to expose pattern region 312 to 314 onto a resist layer of a wafer, namely operation 500 with pattern region 311 shuttered and with pattern regions 313 and 314 exposed. In such an embodiment, pattern region 312 includes seam areas 322 and 321. In some embodiments of a multiple die interposer configuration, an interposer height or length larger than a maximum dimension conventionally allowed by reticle field size of a lithographic scanner may be formed. However, not all embodiments of interposers made from mask 300 have to have a height or length larger than a maximum dimension conventionally allowed by reticle field size of a lithographic scanner. This facilitates use of a single mask 300 to accommodate a variety of configurations to accommodate various sales demands.

FIG. 6 is a block diagram depicting an exemplary embodiment of an interposer 600 printed using mask 300 of FIG. 3. In this exemplary embodiment, interposer 600 is created on a wafer 601 by sequential exposures with pattern regions 313 and 314 exposed with pattern regions 311 and 312 shuttered off. Interposer 600 may be a two IC die configuration as indicated in the shaded area thereof. Each interposer 600 may be imaged at this level using a single exposure. Interposer 600 may be suitable for high-volume production as cost may be reduced with reduce lithographic processing time.

FIG. 7 is a block diagram depicting an exemplary embodiment of an interposer 700 printed using mask 300 of FIG. 3. In this exemplary embodiment, interposer 700 is created on a wafer 701 by sequential exposures with pattern regions 311 through 313 exposed with pattern region 314 shuttered off. Interposer 700 may be a three IC die configuration as indicated in the shaded area thereof. Each interposer 700 may be imaged at this level using a single exposure. Interposer 700 may be suitable for high-volume production as cost may be reduced with reduce lithographic processing time.

FIG. 8 is a block diagram depicting an exemplary embodiment of an interposer 800 printed using mask 300 of FIG. 3. In this exemplary embodiment, interposer 800 is created on a wafer 801 by alternating sequential exposures with pattern regions 312 and 313 exposed with pattern regions 311 and 314 shuttered off for an exposure, followed by having pattern regions 311 and 312 expose with pattern regions 313 and 314 shuttered off for a subsequent exposure. Interposer 800 may be a four IC die configuration as indicated in the shaded area thereof.

Each interposer 800 may be imaged at this level using two exposures, namely one exposure with one shuttering configuration followed by another exposure with another shuttering configuration. Use of two exposures with two shuttering configurations, in contrast to a single exposure and a single shuttering configuration as described with reference to interposers 600 and 700, increases processing time.

FIG. 9 is a block diagram depicting an exemplary embodiment of an interposer 900 printed using mask 300 of FIG. 3. In this exemplary embodiment, interposer 900 is created on a wafer 901, which may be a silicon wafer or other semiconductor wafer. Creation of interposer 900 is an extension of interposer 800 as previously described with reference to FIG. 8, and thus is not described in unnecessary detail for purposes of clarity. Interposer 900 may be for a five IC die configuration as indicated in the shaded area thereof. Interposer 900 may be formed with three exposures thereof with two corresponding shutter settings.

Figure 10:
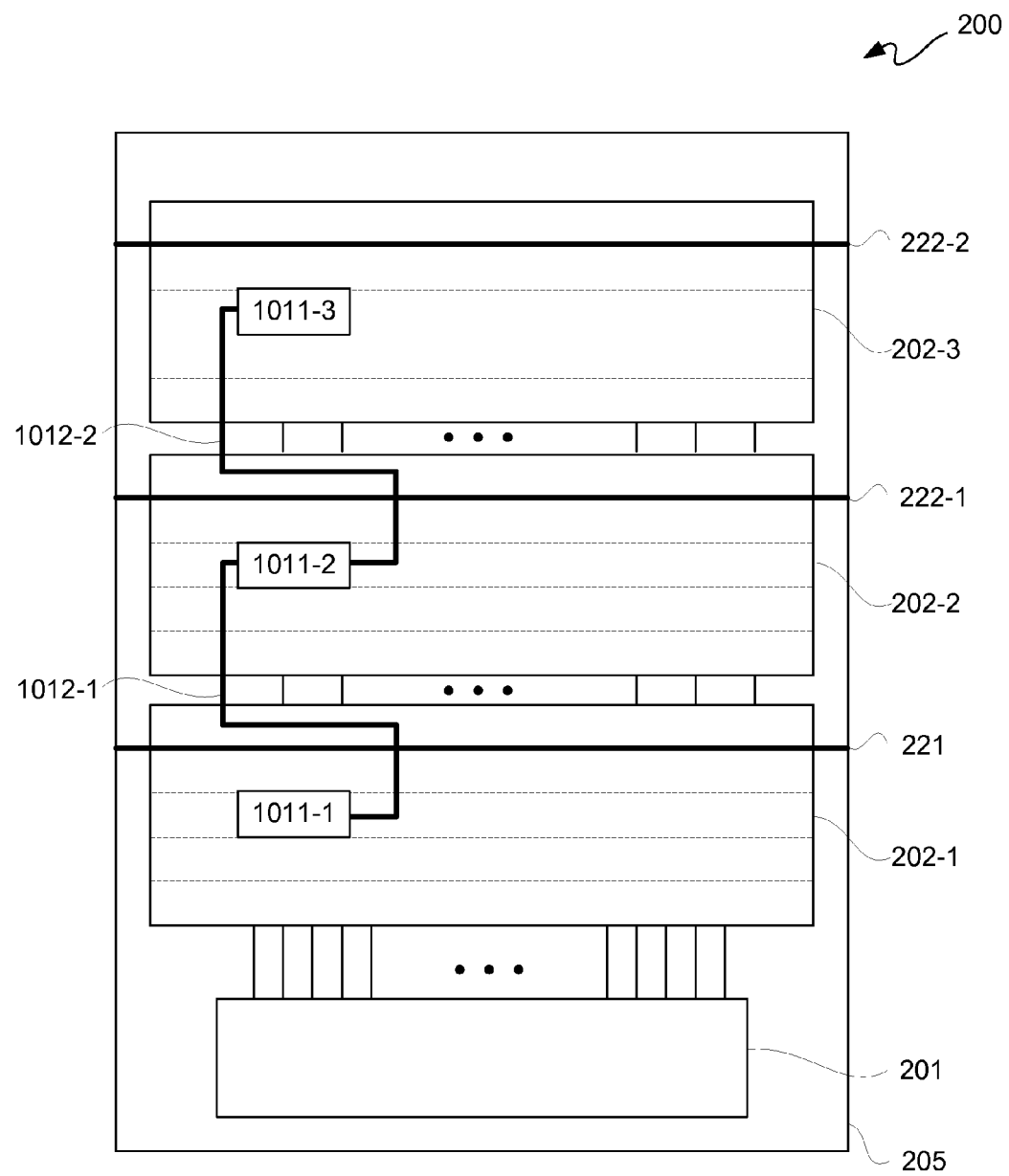
FIG. 10 is a block diagram depicting another exemplary embodiment of a stacked die assembly having seam crossing interconnects.

FIG. 10 is a block diagram depicting another exemplary embodiment of a stacked die assembly 200 having seam crossing interconnects 1012-1 and 1012-2. Even though the number of signals crossing seam regions, such as seam regions 221, 222-1, and 222-2, may involve a small number of traces as compared to all traces on an interposer 205, such signals nevertheless may have to cross seam regions.

With respect to FPGA IC dies 202-1, 202-2, and 202-3, such signals crossing seam regions may include configuration and/or JTAG signals. For purposes of clarity by way of example not limitation, it shall be assumed that signals crossing seam regions are configuration signals, even though these or other types of signals may cross seam regions.

For example, signals beginning from a configuration module 1011-1 of FPGA IC die 202-1 may travel via interconnect 1012-1 to a configuration module 1011-2 of FPGA IC die 202-2 and to a configuration module 1011-3 of FPGA IC die 202-3. Such signals may travel across seam regions 221 and 222-1. Accordingly, micro bumps may be place outside opposing sides of seam regions for interconnecting to passive traces in FPGA IC dies 202-1, 202-2 and 202-3 for bridging such seam regions.

Returning to FIG. 11, where there is shown a block/perspective diagram depicting an exemplary embodiment of a portion of stacked die assembly 200, FPGA IC dies 201-1, 202-2, and 202-3 include configuration modules 1011-1, 1011-2, and 1011-3, respectively. Configuration modules 1011-1, 1011-2, and 1011-3 are interconnected to traces 1103 on an upper most surface of 1150 of interposer 205 with micro bumps 1104 and passive traces 1111-1, 1111-2, and 1111-3, respectively, of FPGA IC dies 202-1, 202-2, and 202-3. Such micro bumps, interposer traces and die traces may provide interconnects 1012-1 and 1012-2 of FIG. 10. Micro bumps 1104 are disposed on opposing sides of seam regions 221, 222-1, and 222-2. Accordingly, by routing signals up to passive traces 1111-1, 1111-2, and 1111-3 of FPGA IC dies 201-1, 202-2, and 202-3, respectively, seam regions 221, 222-1, and 222-2 may respectively be bridged.

FIG. 12 is a block/circuit diagram depicting an exemplary embodiment of a repeatable die 1200. Repeatable die 1200 includes traces for die area interconnects 1210. Die area interconnects 1210 includes interconnects 1201, module interconnects 1202, and interconnects 1203. Module interconnects 1202 may be for a configuration module 1011 or other IC module. For purposes of clarity by way of example and not limitation, it shall be assumed that module interconnects 1202 are for a configuration module 1011. A signal of configuration module 1011 may be a chip select signal ("CS"). Even though a chip select signal is illustratively depicted, any type of signal may be used. Furthermore, interconnects 1203 may be for passive traces in an FPGA IC die 202 for bridging a seam region, as described below in additional detail. Repeatable die 1200 may be a die that matches a pattern made by regions 311 and 312 of mask 300 on interposer 1300 of FIG. 13.

FIG. 13 is a block diagram/circuit depicting an exemplary embodiment of a multi-section interconnect mask 1300. Multi-section interconnect mask 1300 includes pattern section 1301 through pattern section 1304. Pattern section 1301 includes interconnects 1311. Pattern section 1302 includes images for interconnects 1312. Pattern section 1303 includes images for interconnects 1313, and pattern section 1304 includes images for interconnects 1314.

Assuming module interconnects 1202 are for an FPGA IC die, as previously described, an interposer may have interconnects for each FPGA IC die created using multi-step exposures of a single multi-section interconnect mask 1300, as described below in additional detail.

Figure 14:
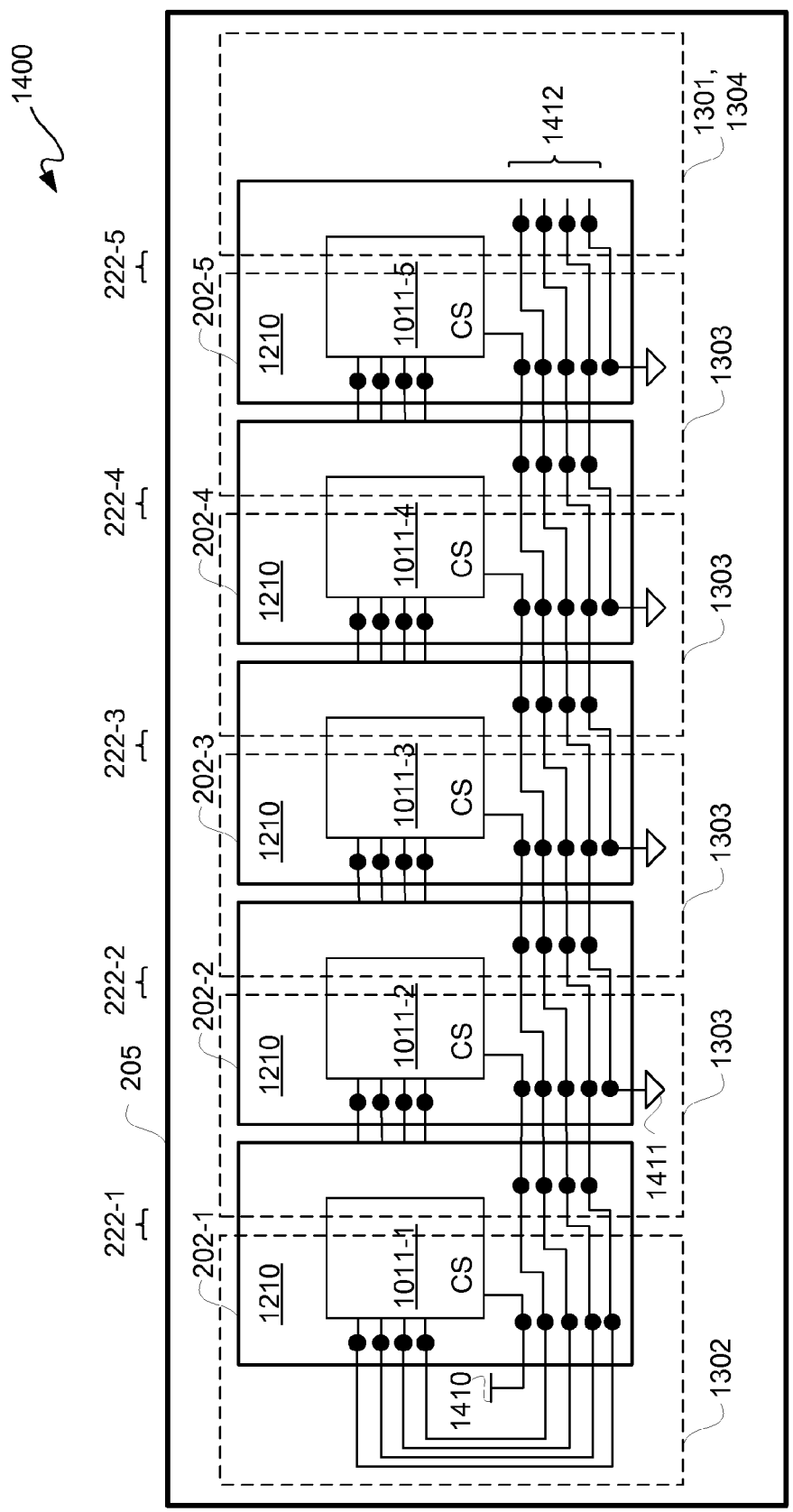
FIG. 14 is a block diagram depicting an exemplary embodiment of a stacked die assembly having an interposer printed with the multi-section interconnect mask of FIG. 13 and the repeatable die 1200 of FIG. 12.

FIG. 14 is a block diagram depicting an exemplary embodiment of a stacked die assembly 1400 having an interposer 205 printed with multi-section interconnect mask 1300 of FIG. 13 and repeatable die 1200. Stacked die assembly 1400 further includes FPGA IC dies 202-1 through 202-5 coupled to interposer 205, where FPGA IC dies 202-1 through 202-5 respectively include configuration modules 1011-1 through 1011-5. Traces in interconnects which may be under or within FPGA IC dies 202-1 through 202-5, as well as configuration modules thereof, are illustratively depicted along with traces and interconnects of interposer 205 for purposes of clarity.

Repeated placement of repeatable die 1200 may be as previously described. In this embodiment, FPGA IC dies 202-1 through 202-5 respectively bridge seam regions 221-1 through 222-5 formed between interposer mask exposure regions 1302 through 1304.

By use of pattern section 1302, interconnects for FPGA IC die 202-1 on interposer 205 may be created, where a CS port associated with configuration module 1011-1 is tied to a logic high voltage to indicate such configuration module is a master module. Such interconnects for FPGA IC die 202-1 on interposer 205 may further be created by use of pattern section 1302 for initial routing of configuration signals to be passed to CS ports of configuration modules 1011-2 through 1011-5.

By repeated use of pattern section 1303, such configuration signals on interposer 202 may effectively be successively passed or bussed to configuration modules 1011-2 through 1011-5. Additionally, by repeated use of pattern section 1303, FPGA IC die-to-die interconnects may be formed. Furthermore, configuration modules 1011-2 through 1011-5 may be identified as slave modules with respect to configuration module 1011-1 having a CS port tied to a logic high supply level 1410. Use of technology for forming a stacked die assembly 1400 allows all identical die 202 to have a unique hook-up using an interposer made from repeated exposure of the same mask region 1303 and resulting metallization patterns.

Along those lines, a pattern region of a mask, such as pattern region 312 of mask 300 of FIG. 3 for example, effectively may be amended by application of pattern section 1303 for example, to create various configurations of interposers. Again, even though a master-slave arrangement among FPGA IC dies is illustratively depicted, it should be understood that by using various configurations of mask interconnect sections, different associations may be obtained from a single mask. End connections of such configuration bus may be formed using pattern section 1301 or 1304, where each such unused end 1412 may be coupled to ground 1411 so as not to be floating.

Figure 15:
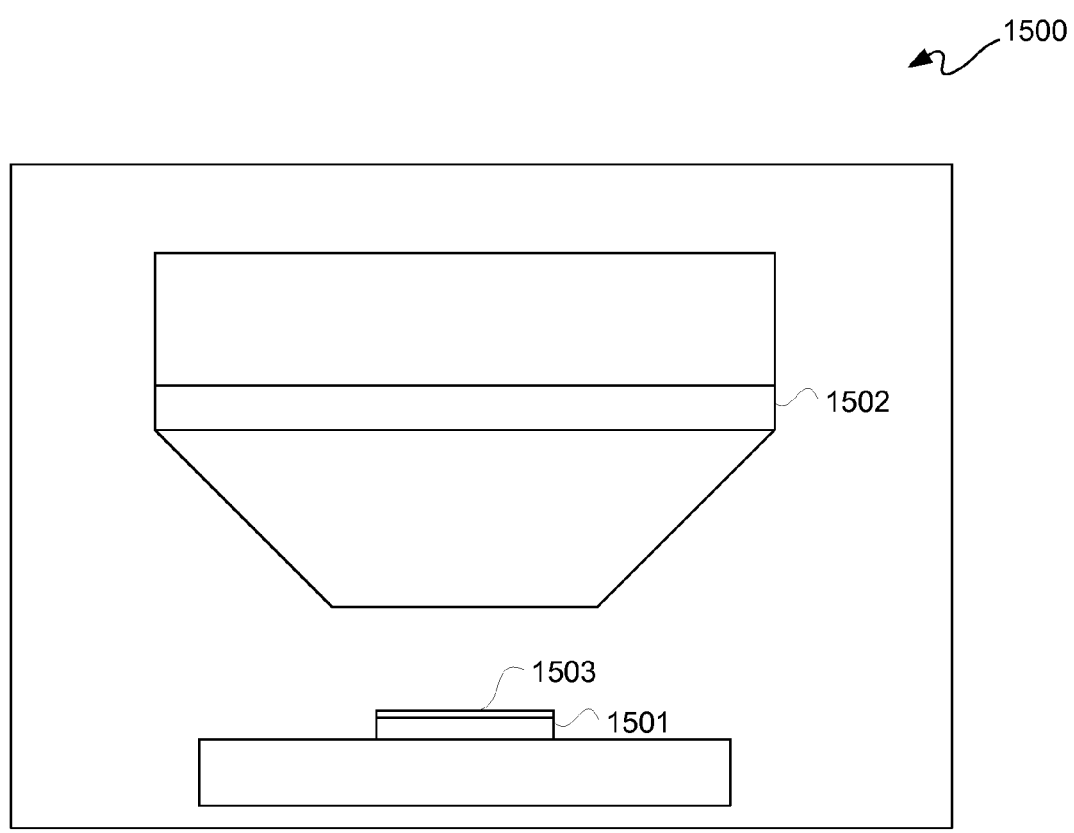
FIG. 15 is a block diagram depicting an exemplary embodiment of a conventional lithographic scanner.

FIG. 15 is a block diagram depicting an exemplary embodiment of a conventional lithographic scanner 1500. Loaded into lithographic scanner 1500 are wafer 1501 and mask 1502. Wafer 1501 may have a resist layer 1503.

Figure 16:
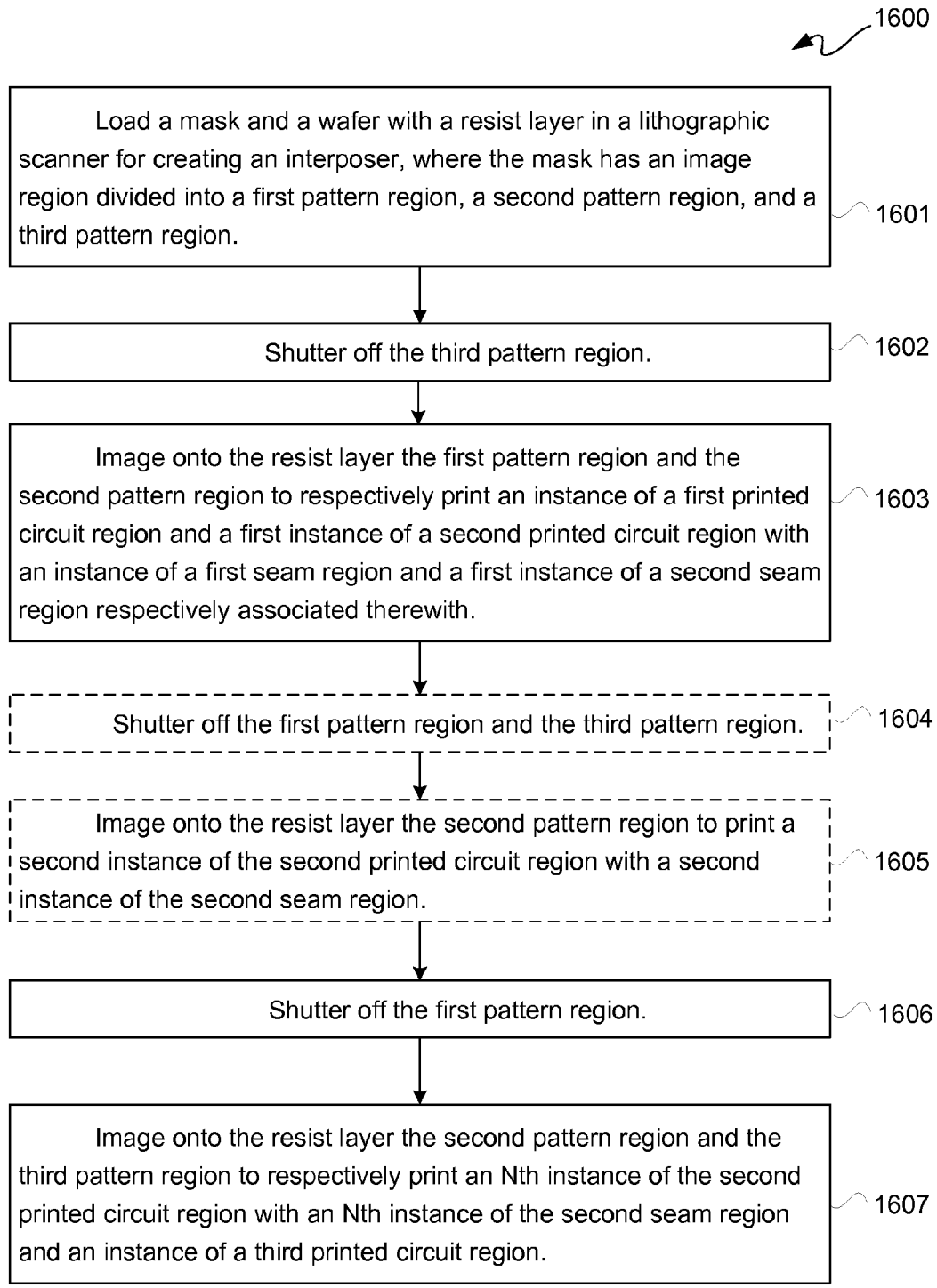
FIG. 16 is a flow diagram depicting an exemplary embodiment of a lithographic imaging ("printing") flow for printing onto a resist layer of a wafer used to provide at least one interposer.

FIG. 16 is a flow diagram depicting an exemplary embodiment of a lithographic imaging ("printing") flow 1600 for printing onto a resist layer of a wafer used to provide at least one interposer. Printing flow 1600 is described with simultaneous reference to FIGS. 1 through 16.

At 1601, a mask, such as mask 300 for example, and a wafer, such as wafer 1501 for example, is loaded into a lithographic scanner, such as lithographic scanner 1500 for example. Wafer 1501 may have a resist layer 1503. Furthermore, such mask 300 may have an image region 310 divided into the plurality of pattern regions, such as pattern regions 311 through 314 for example. Such plurality of pattern regions may include a first pattern region, a second pattern region, and a third pattern region, such as previously described herein for example with reference to pattern regions 311 through 313.

At 1602, a third pattern region of such mask is shuttered off in the lithographic scanner. At 1603, the first pattern region and the second pattern region may be imaged onto the resist layer to respectively print an instance of a first printed circuit region and a first instance of a second printed circuit region, respectively. With such printing of an instance of the first printed circuit region, an instance of a first seam region, such as seam region 221, may be printed. Likewise, with such printing of a first instance of the second printed circuit region, a first instance of the second seam region, such as a seam region 222, may be printed.

At 1604, the first pattern region and the third pattern region may be shuttered off in the lithographic scanner. At 1605, the second pattern region may be again imaged onto the resist layer, though at a different location, to print a second instance of the second printed circuit region with a second instance of the second seam region. Such printing may cause the first instance of the second printed circuit region to order the second instance of the second printed circuit region, where the first instance of the second seam region is generally located between the first and second instances of the second printed circuit region. Along those lines, multiple iterations of printing instances of the second printed circuit region may be repeated for a number of die slices.

Once a number of die slices have been printed, at 1606 the first pattern region may be shuttered off in the lithographic scanner. At 1607, the second pattern region and the third pattern region may be imaged onto the resist layer to respectively print an nth instance of the second pattern circuit region with an nth instance of the second seam region and an instance of a third printed circuit region, respectively. Accordingly, formation of multiple interposers from a single mask set has been described. Such interposers may be formed with at least one dimension larger than available from a conventional maximum reticle field size limit of a lithographic scanner. By using one mask with multiple pattern regions or sections, more efficiency in fabricating interposers may be obtained than having multiple masks which have to be stored in and/or changed out. In other words, handling multiple masks for a product involves changing masks and realigning masks, which may be avoided by having a single mask with multiple pattern regions or sections.

In addition to having formed long interposers, various configurations of such interposers may be formed using a single mask having multiple pattern regions or sections. Even though the above description was in terms of height or length, again it should be understood that either or both height or width may exceed maximum dimensions associated with a conventional reticle field size limit. Furthermore, because various configurations may be formed using a single mask, interposer configurations which heretofore may have not been cost-effective to manufacture due to low volume, may now be manufactured by effectively leveraging volumes associated with other configurations formed using such a single mask. Moreover, such masks may have various interconnect structures for creating uniqueness or other form of differentiation among dies on an interposer, such as for master-slave, identification, or other form of differentiation.

While the foregoing describes exemplary embodiments, other and further embodiments in accordance with the one or more aspects may be devised without departing from the scope thereof, which is determined by the claims that follow and equivalents thereof. Claims listing steps do not imply any order of the steps. Trademarks are the property of their respective owners.

What is claimed is:

1. An interposer, comprising:
   a first printed circuit region; and
   a second printed circuit region proximate to the first printed circuit region with a first seam region between the first printed circuit region and the second printed circuit region;
   wherein the first seam region includes a first die seal and a second die seal spaced apart from one another with a first scribe line located between the first die seal and the second die seal.

2. The interposer according to claim 1, further comprising:
   a third printed circuit region proximate to the second printed circuit region with a second seam region between the second printed circuit region and the third printed circuit region;
   wherein the second seam region includes a third die seal and a fourth die seal spaced apart from one another with a second scribe line located between the third die seal and the fourth die seal.

3. The interposer according to claim 2, further comprising:
a fourth printed circuit region proximate to the third printed circuit region with a third seam region between the third printed circuit region and the fourth printed circuit region;
wherein the third seam region includes a fifth die seal and a sixth die seal spaced apart from one another with a third scribe line located between the fifth die seal and the sixth die seal.

4. The interposer according to claim 1, wherein length or width of the interposer is greater than a maximum length or a maximum width, respectively, of a reticle field size of a lithographic scanner used to print the first printed circuit region and the second printed circuit region.

5. The interposer according to claim 4, wherein:
the maximum length for the reticle field size is at least 33 mm; and
the maximum width for the reticle field size is at least 26 mm.

6. A stacked die assembly including the interposer of claim 4, the stacked die assembly comprising:
a first integrated circuit die coupled to the interposer in the first printed circuit region; and
a second integrated circuit die coupled to the interposer in the second printed circuit region;
wherein the first integrated circuit die bridges the first seam region.

7. The stacked die assembly according to claim 6, further comprising:
a third printed circuit region proximate to the second printed circuit region with a second seam region between the second printed circuit region and the third printed circuit region;
wherein the second seam region includes a third die seal and a fourth die seal spaced apart from one another with a second scribe line located between the third die seal and the fourth die seal; and
wherein the second integrated circuit die bridges the second seam region.

8. A lithographic mask, comprising:
an image region divided into a first pattern region, a second pattern region, and a third pattern region;
wherein the first pattern region is for interconnecting a first portion of a first die to an interposer;
wherein the second pattern region is for interconnecting a second portion of the first die and a first portion of a second die to the interposer;
wherein the third pattern region is for interconnecting a second portion of the second die to the interposer; and
wherein the second pattern region is repeatable for the interposer to have a length or a width greater than a maximum length or a maximum width, respectively, of a reticle field size of a lithographic scanner.

9. The lithographic mask according to claim 8, wherein:
the first pattern region is further for interconnecting a third die to the interposer;
the first die and the second die are a same type of die;
the first die and the second die are modular die; and
the third die is a different type of die with respect to the first die and the second die.

10. The lithographic mask according to claim 9, wherein:
the maximum length for the reticle field size is at least 33 mm; and
the maximum width for the reticle field size is at least 26 mm.

11. The lithographic mask according to claim 8, wherein:
the first pattern region includes a first seam region; and
the second pattern region includes a second seam region.

12. The lithographic mask according to claim 11, wherein each of the first seam region and the second seam region include a pair of die seals.

13. The lithographic mask according to claim 11, wherein each of the first seam region and the second seam region include a scribe line located between the pair of die seals thereof.

14. A set of lithographic masks including the lithographic mask of claim 8 as a first lithographic mask, further comprising:
a second lithographic mask having an image area divided into a first interconnect section and a second interconnect section;
wherein the first interconnect section includes a first interconnect pattern; and
wherein the second interconnect section includes a second interconnect pattern.

15. The set of lithographic masks according to claim 14, wherein:
the first interconnect section is for interconnection of the first die as a master die; and
the second interconnect section is for interconnection of the second die as a slave die with respect to the master die.

16. The set of lithographic masks according to claim 15, wherein:
the first pattern region is amended with the first interconnect section; and
the second pattern region is amended with the second interconnect section.

17. A method for lithographically printing, comprising:
loading a mask and a wafer with a resist layer in a lithographic scanner for creating an interposer;
wherein the mask has an image region divided into a first pattern region, a second pattern region, and a third pattern region;
shuttering off the third pattern region;
imaging onto the resist layer the first pattern region and the second pattern region to respectively print an instance of a first printed circuit region and a first instance of a second printed circuit region with an instance of a first seam region and a first instance of a second seam region respectively associated therewith;
shuttering off the first pattern region; and
imaging onto the resist layer the second pattern region and the third pattern region to respectively print a second instance of the second printed circuit region with a second instance of the second seam region and an instance of a third printed circuit region;
wherein the second pattern region with the second seam region is repeatable for the interposer to have a length or width greater than a maximum length or a maximum width, respectively, of a reticle field size of the lithographic scanner.

18. The method according to claim 17, wherein:
the first seam region separates the first printed circuit region from the first instance of the second printed circuit region;
the first instance of the second seam region separates the first instance of the second printed circuit region from the second instance of the second printed circuit region;
the second instance of the second seam region separates the second instance of the second printed circuit region from the third printed circuit region; and each of the first seam region, the second seam region, and the third seam region includes a first die seal and a second die seal spaced apart from one another with a scribe line located between the first die seal and the second die seal.

19. The method according to claim 18, wherein:

the first printed circuit region has first passive connections and the second printed circuit region has second passive connections for interconnection of a first die for bridging the first seam region; and the first passive connections are asymmetrically different from the second passive connections to provide a different interconnection for a second die identical to the first die.

* * * * *